United States Patent
Kadota et al.

[11] Patent Number: 5,977,686
[45] Date of Patent: Nov. 2, 1999

[54] SURFACE ACOUSTIC WAVE FILTER

[75] Inventors: Michio Kadota, Kyoto; Kazuhiko Morozumi, Ishikawa-gun; Haruo Morii, Kanazawa, all of Japan

[73] Assignee: Murata Manufacturing Co., Ltd., Kyoto, Japan

[21] Appl. No.: 09/008,138

[22] Filed: Jan. 15, 1998

[30] Foreign Application Priority Data

Jan. 20, 1997 [JP] Japan ................................... 9-007812
Dec. 25, 1997 [JP] Japan ................................... 9-357790

[51] Int. Cl.$^6$ ................................................ H01L 41/08
[52] U.S. Cl. ......................................................... 310/313 B
[58] Field of Search ........................... 310/313 R, 313 B, 310/313 D; 333/193–196

[56] References Cited

U.S. PATENT DOCUMENTS

| | | | |
|---|---|---|---|
| 5,264,751 | 11/1993 | Dufillie et al. | 310/313 B |
| 5,550,793 | 8/1996 | Dufilie | 310/313 B X |
| 5,714,830 | 2/1998 | Kadota et al. | 310/313 B X |
| 5,793,147 | 8/1998 | Kadota et al. | 310/313 B X |
| 5,802,685 | 9/1998 | Kadota et al. | 310/313 B X |
| 5,838,217 | 11/1998 | Kadota et al. | 310/313 B X |

FOREIGN PATENT DOCUMENTS

2 244 880 12/1991 United Kingdom.

Primary Examiner—Mark O. Budd
Attorney, Agent, or Firm—Graham & James LLP

[57] ABSTRACT

A transversal-coupled resonator type surface acoustic wave filter includes a piezoelectric substrate and first and second interdigital transducers. The piezoelectric substrate has a pair of substrate edges which are substantially parallel to each other and reflect a shear horizontal type surface wave excited and propagated on a surface of the piezoelectric substrate in a direction perpendicular to the substrate edges. The first and second interdigital transducers have the same resonance characteristics and are provided on the piezoelectric substrate. Each of the first and second interdigital transducers includes a pair of outermost electrode fingers which are arranged to be flush with the substrate edges of the piezoelectric substrate, respectively and a pair of adjacent electrode fingers which are adjacent to the pair of the outermost electrode fingers, respectively. A distance D' from one of the substrate edges of the piezoelectric substrate to a center of the corresponding adjacent electrode fingers satisfies the following inequalities:

$$\lambda/2 < D' \leq (\lambda/2) + (5\lambda)/16$$

where $\lambda$ is a wavelength of the shear horizontal type surface acoustic wave excited on the piezoelectric substrate.

11 Claims, 7 Drawing Sheets

SURFACE ACOUSTIC WAVE FILTER

BACKGROUND OF THE INVENTION

1. Field of the Invention

The present invention relates to a surface acoustic wave filter utilizing shear horizontal type (SH type) surface acoustic waves, and more particularly, to a transversal-coupled resonator type surface acoustic wave (hereinafter referred to as SAW) filter.

2. Description of the Related Art

Transversal-coupled resonator type double mode SAW filters utilizing Rayleigh waves are known. An example of this type of lateral coupling type SAW filter will be described with reference to FIG. 6.

Figure 6:
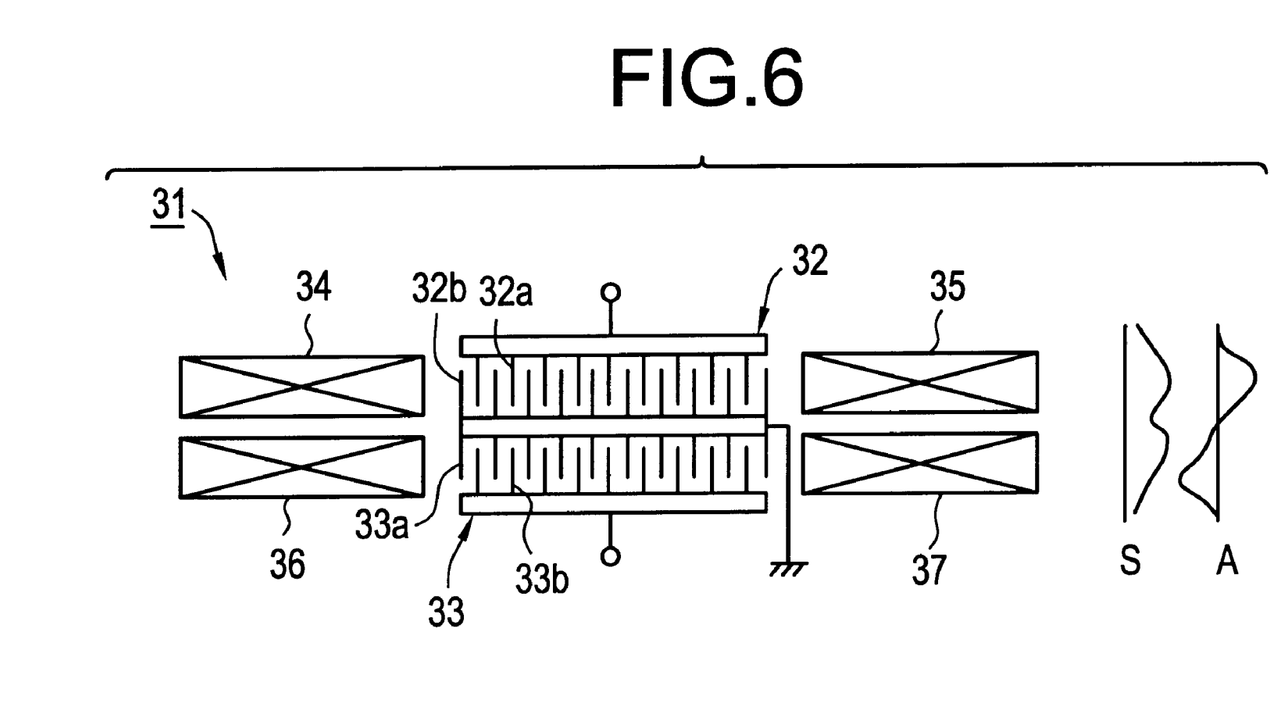
FIG. 6 is a schematic plan view for explaining an example of a conventional transversal-coupled resonator type double mode SAW filter.

FIG. 6 is a simplified plan view for explaining a configuration of electrodes of a conventional transversal-coupled resonator type SAW filter using Rayleigh waves. A SAW filter 31 has a structure wherein first and second interdigital transducers (hereinafter abbreviated to read "IDTs") 32 and 33 are provided on a piezoelectric substrate (not shown) and grating reflectors 34, 35, 36, 37 are provided on both sides of the IDTs 32 and 33.

The IDT 32 includes a pair of comb-shaped electrodes 32a, 32b each having at least one electrode finger. The comb-shaped electrode 32a and the comb-shaped electrode 32b are arranged such that their electrode fingers are interdigitated with each other. Similarly, the IDT 33 includes a pair of comb-shaped electrodes 33a and 33b.

The space between adjacent electrode fingers of the IDTs 32 and 33 is set to be $\lambda/4$, and the width of each electrode finger is set to be $\lambda/4$. $\lambda$ represents the wavelength of a surface acoustic wave to be excited in the surface acoustic wave filter. The comb-shaped electrode 32b of the IDT 32 and the comb-shaped electrode 33a of the IDT 33 share a common bus. The comb-shaped electrode 32a of the IDT 32 is the input electrode and the comb-shaped electrode 33b of the other IDT 33 is the output electrode of the SAW filter 31. The comb-shaped electrodes 32b and 33a are grounded.

When an input voltage is applied to the IDT 32, surface acoustic waves are excited at the IDT 32 and the excited surface acoustic waves are propagated in a direction perpendicular to the direction in which the electrode fingers extend and are reflected between the reflectors 34 and 35 to become a standing wave. An output that is based on this standing wave is obtained at the IDT 33.

In the SAW filter 31, a surface acoustic wave of a symmetric mode indicated by the solid line S in FIG. 6 and a surface acoustic wave of an asymmetric mode indicated by the solid line A are generated. Thus, the SAW filter 31 operates as a transversal-coupled resonator type double mode SAW filter.

While the first and second IDTs 32 and 33 of the SAW filter 31 shown in FIG. 6 are coupled in a direction perpendicular to the propagating direction of surface acoustic waves, i.e., in a lateral direction, a configuration is also known in which a plurality of SAW resonators having the above-described first and second IDTs 32 and 33 are further coupled in the lateral direction. In a SAW filter 41 shown in FIG. 7, transversal-coupled resonator type SAW filters having IDTs 32 and 33 are transversally coupled to each other in the form of three stages. The configuration of each of the IDTs and reflectors is the same as that in the SAW filter 31 shown in FIG. 6.

Figure 7:
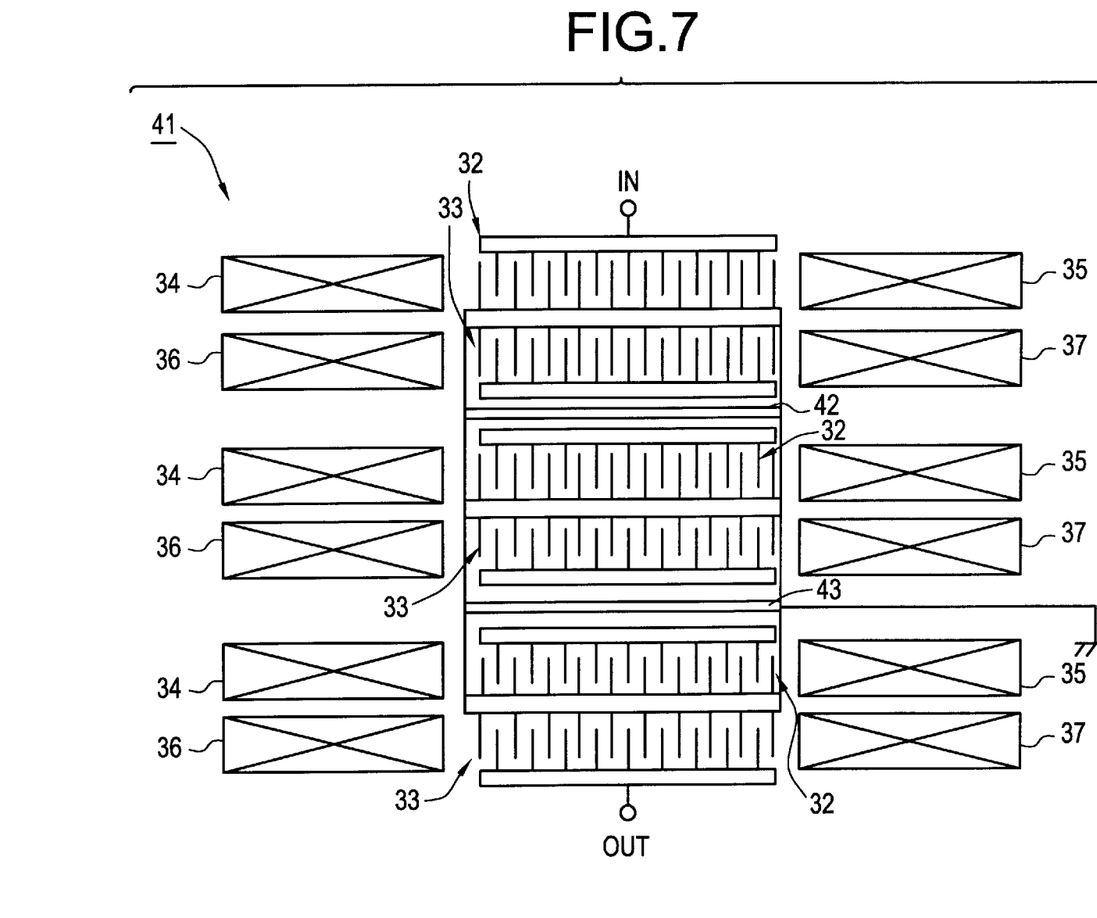
FIG. 7 is a schematic plan view for explaining another example of a conventional transversal-coupled resonator type double mode SAW filter.

In the SAW filter 41, a comb-shaped electrode of IDT 32 of the upper stage is used as the input end as illustrated, and an outer comb-shaped electrode of an IDT 33 of the SAW filter at the final stage is used as the output electrode. Conductive patterns 42 and 43 connected to the ground potential are provided between the stages, and the conductive patterns 42 and 43 are connected to a bus bar which is connected to the ground potential of the SAW filter at each stage.

As described above, in a conventional transversal-coupled resonator type SAW filter utilizing a Rayleigh wave, reflectors 34 through 37 have been required on both sides of IDTs 31 and 32 in order to produce a standing wave. Such reflectors have a structure in which a multiplicity of electrodes fingers are short-circuited or open-circuited. Therefore, it has been necessary to increase the dimensions of the substrate according to an amount required for providing the reflectors 34 through 37.

Further, in the case of conventional SAW filters 31, 41, there has been a problem in that only a filter having a narrow band can be configured because the electromechanical coupling coefficient of a piezoelectric substrate is not so great.

Accordingly, there has been a demand for a transversal-coupled resonator type SAW filter which can be formed with smaller overall dimensions and which has wider band characteristics.

SUMMARY OF THE INVENTION

The present invention is directed to a transversal-coupled resonator type SAW filter that overcomes the above-described problems of the prior art and provides a transversal-coupled resonator type SAW filter having a reduced size and providing increased band characteristics.

A transversal-coupled resonator type SAW filter according to a preferred embodiment of the present invention includes a piezoelectric substrate and first and second interdigital transducers. The piezoelectric substrate has a pair of substrate edges which are substantially parallel to each other and reflect a shear horizontal type surface wave which is excited and propagated on a surface of the piezoelectric substrate in a direction which is substantially perpendicular to the substrate edges. The first and second interdigital transducers have the same resonance characteristics and are provided on the piezoelectric substrate. Each of the first and second interdigital transducers includes a pair of outermost electrode fingers which are arranged to be flush with the substrate edges of the piezoelectric substrate, respectively and a pair of adjacent electrode fingers which are adjacent to the pair of the outermost electrode fingers, respectively. A distance D' from one of the substrate edges of the piezoelectric substrate to a center of the corresponding adjacent electrode finger satisfies the following inequalities:

$$\lambda/2 < D' \leq (\lambda/2) + (5\lambda)/16$$

where $\lambda$ is a wavelength of the shear horizontal type surface acoustic wave excited on the piezoelectric substrate.

In one preferred embodiment, a plurality of the above-described transversal-coupled resonator type SAW filters are arranged on the same substrate to provide a multi-stage connection type SAW filter.

In the transversal-coupled resonator type SAW filter, the piezoelectric substrate preferably has a roughened back surface. The roughened back surface may have a plurality of grooves provided therein.

The first and second interdigital transducers preferably include first and second comb-shaped electrodes each having a bus bar and a plurality of electrode fingers connected to the bus bar, the first and second comb-shaped electrodes being interdigitated with each other. The second comb-shaped electrode of the first interdigital transducer is arranged to share the bus bar of the first comb-shaped electrode of the second interdigital transducer.

The pair of outermost electrode fingers preferably have a width w' which satisfies the following inequalities:

$$\lambda/8 < w' \leq (7\lambda)/16.$$

According to the preferred embodiments of the present invention, since a transversal-coupled resonator type double mode SAW filter is configured utilizing an SH type surface wave and as a substrate edge reflection type surface wave device, there is no need for providing reflectors on both sides of IDTs. This makes it possible to significantly reduce the size of a SAW filter.

In addition, since no reflector is used and hence there is no influence on the stop band due to reflectors and SAW propagation decay between IDTs and reflectors, a wide band can be achieved to prevent any increase in insertion loss. Thus, it is possible to provide a SAW filter having smaller insertion loss and a wider band compared to conventional transversal-coupled resonator type SAW filters.

Further, by setting the outermost electrode finger distance defined by a distance from the substrate edge of the piezoelectric substrate to the center of the electrode finger adjacent to the outermost electrode finger located at the substrate edge at a specific value, unwanted ripples in the passband are decreased.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

A SAW filter according to preferred embodiments of the invention is a transversal-coupled resonator type double mode SAW filter utilizing an SH type surface wave. In this specification, an SH type surface wave means a surface wave whose displacement is substantially perpendicular to the propagating direction of the surface wave and is parallel to the surface of the substrate. For example, such SH type surface waves include SH type leaky waves, Love waves and BGS (Bleustein-Gulyaev-Shimizu) waves.

Figure 1:
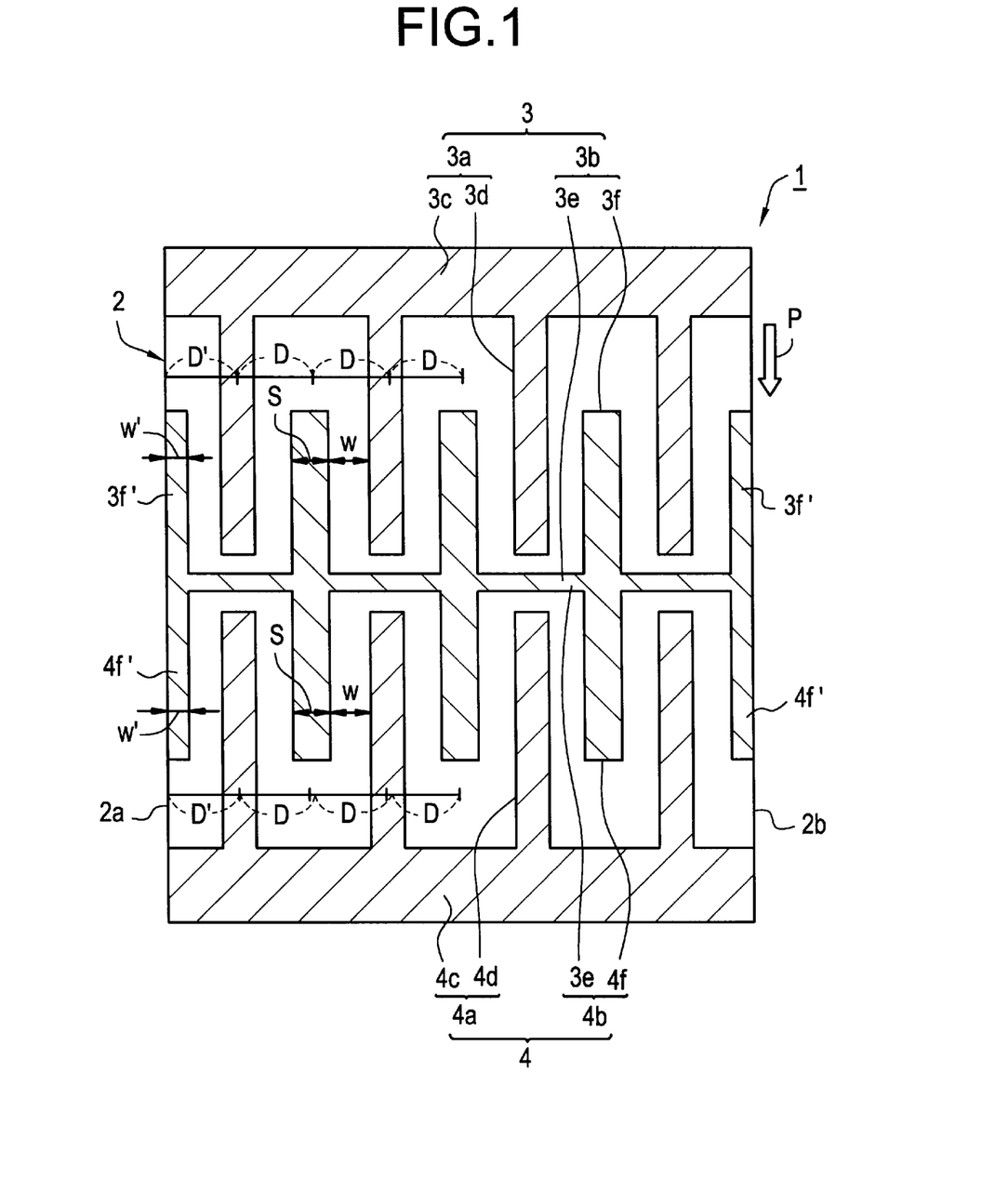
FIG. 1 is a plan view for explaining a SAW filter according to a preferred embodiment of the present invention.

FIG. 1 shows a plan view of an SAW filter 1 according to a first preferred embodiment of the present invention. The SAW filter 1 includes a piezoelectric substrate 2, a first IDT 3 and a second IDT 4.

The piezoelectric substrate 2 is preferably formed of a piezoelectric single crystal such as an LiTaO$_3$ and an LiNbO$_3$ or PZT type piezoelectric ceramics. The piezoelectric substrate 2 has a substantially rectangular planar shape and includes a pair of substrate edges 2a and 2b which are preferably substantially parallel to each other. The piezoelectric substrate 2 is polarized in the direction of the arrow P which is substantially parallel to the substrate edges 2a and 2b.

The first and second IDTs 3 and 4 are disposed on the upper surface of the piezoelectric substrate 2. The first and second IDTs 3 and 4 preferably have the same resonance characteristics and are arranged in a direction substantially parallel to the substrate edges 2a and 2b so as to be located between the substrate edges 2a and 2b.

The IDT 3 includes comb-shaped electrodes 3a and 3b each having one or more electrode fingers. Specifically, the comb-shaped electrode 3a comprises a bus bar 3c and electrode fingers 3d connected to the bus bar 3c, and the comb-shaped electrode 3b comprises a bus bar 3e and electrode fingers 3f connected to the bus bar 3e. The IDT 3 is arranged on the piezoelectric substrate 2 such that the electrode fingers 3d of the comb-shaped electrodes 3a and the electrode fingers 3f of the comb-shaped electrodes 3b extend in a direction substantially parallel to the substrate edges 2a and 2b and are interdigitated between each other.

A pair of outermost fingers 3f' of the IDT 3 extending in the propagating direction of a surface wave are preferably arranged to be flush with the substrate edges 2a and 2b, respectively. Although in the IDT 3 shown in FIG. 1, the outermost fingers of the comb-shaped electrode 3b are the outermost electrode fingers 3f' of IDT 3, the outermost electrode fingers of the comb-shaped electrode 3a may be arranged to be flush with the substrate edges 2a and 2b. In this case, the outermost fingers of the comb-shaped electrode 3a become the outermost electrode fingers of the IDT 3. Moreover, one outermost finger of the comb-shaped electrode 3a is arranged to be flush with either the substrate edges 2a or 2b, and one outermost electrode finger of the comb-shaped electrode 3b may be arranged to be flush with either the substrate edges 2b or 2a. That is, the IDT 3 has a pair of outermost fingers which are arranged to be flush with the substrate edges 2a and 2b, respectively, regardless of the outermost fingers, whereby both ends of the IDT 3 are flush with the substrate edges 2a and 2b of the piezoelectric substrate 2, respectively.

Similarly, the IDT 4 includes comb-shaped electrodes 4a and 4b each having one or more electrode fingers. The number of the pair of electrode fingers in IDT 4 is preferably set to be the same as that in the IDT 3 so that the IDTs 3 and 4 have the same resonance characteristics. Specifically, the comb-shaped electrode 4a comprises a bus bar 4c and electrode fingers 4d connected to the bus bar 4c. The comb-shaped electrode 4b comprises the bus bar 3e and electrodes fingers 4f connected to the bus bar 3e. The bus bar 3e is shared between the comb-shaped electrode 4b and the comb-shaped electrode 3b. The IDT 4 is arranged on the piezoelectric substrate 2 such that the electrode fingers 4d of the comb-shaped electrodes 4a and the electrode fingers 4f of the comb-shaped electrodes 4b extend in a direction substantially parallel to the substrate edges 2a and 2b and are interdigitated with each other.

Outermost fingers 4f' of the IDT 4 extending in the propagating direction of a surface wave are arranged to be flush with the substrate edges 2a and 2b. One or a pair of outermost electrode fingers of the comb-shaped electrode 4a may be arranged to be flush with the substrate edges 2a and/or 2b in accordance with the configuration of the IDT 3. Thus, the IDT 4 also has a pair of outermost fingers which are flush with the substrate edges 2a and 2b, respectively, regardless of the outermost fingers, whereby both ends of the IDT 4 are flush with the substrate edges 2a and 2b of the piezoelectric substrate 2, respectively.

In the IDTs 3 and 4, an electrode finger distance D defined by a distance from the center of one of the electrode fingers to the center of the adjacent electrode finger is preferably set to be equal to about $\lambda/2$, where $\lambda$ is the wavelength of the SH type surface wave excited on the substrate 2. The outermost electrode finger distance D' defined by a distance from the substrate edges 2a or 2b to the center of the electrode finger adjacent to the outermost electrode finger 3f' or 4f' is preferably set to be a value defined by the following inequalities:

$$\lambda/2 < D' \leq \lambda/2 + (5\lambda)/16 \quad (1)$$

Conventionally, it has been thought that each electrode finger distance (i.e., the distance D and the distance D') between electrode fingers of IDTs must be set to be $\lambda/2$ so that a standing wave exists on a SAW device. However, the inventors of the present invention have first found that the outermost electrode finger distance D' can be changed from $\lambda/2$ without causing substantial deterioration in the filter characteristic and that the filter characteristic is improved if the distance D' satisfies the aforementioned inequalities. The feature will be explained in detail in the specific example below.

The distance L between the substrate edge 2a and the substrate edge 2b is therefore preferably set to be a value defined by the following inequalities:

$$(\lambda/2) \times n < L \leq (\lambda/2) \times n + (10\lambda)/16 \quad (2)$$

where n is an integer equal to 1 or more.

In the case where the width w of the electrode fingers and the space gap s between the electrode fingers are set to be the same i.e., to be about $\lambda/4$, the width w' of the outermost fingers 3f' and 4f' is preferably set to be a value defined by the following inequalities:

$$\lambda/8 < w' \leq (7\lambda)/16 \quad (3)$$

Figure 2:
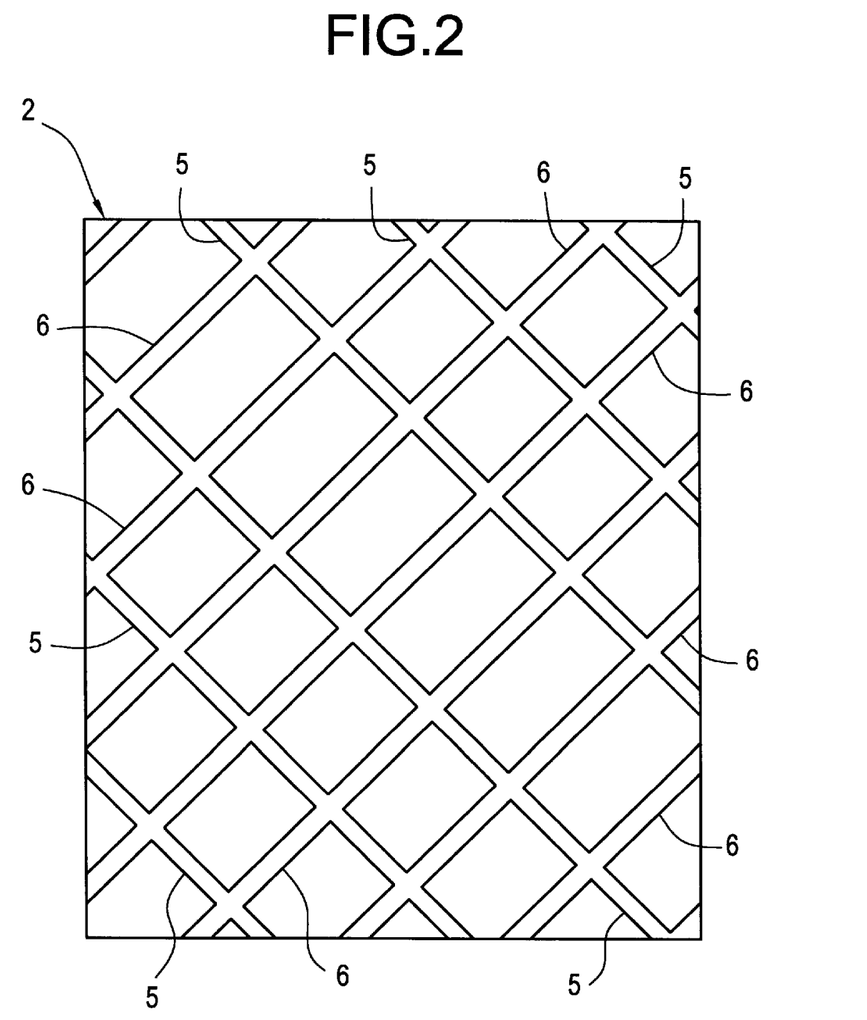
FIG. 2 is a bottom view of a piezoelectric substrate of the SAW filter shown in FIG. 1.

Further, as shown in FIG. 2, it is preferable that the piezoelectric substrate 2 of the SAW filter 1 has a plurality of grooves 5 and 6 located on the back surface of the piezoelectric substrate 2. The formation of the grooves 5 and 6 roughens the surface of the piezoelectric substrate which is opposite to the side on which the IDTs 3, 4 are located. By roughening the surface opposite to the surface of the piezoelectric substrate on which the IDTs 3 and 4 are provided as described above, it is possible to effectively suppress unwanted spurious response caused by a bulk wave that appears in the filter characteristics. The number and arrangement of the grooves are not limited to that illustrated in FIG. 2, and the back surface may be roughened by a method other than forming grooves. Random recesses may be formed on the back surface of the piezoelectric substrate 2. Alternatively, the back surface of the piezoelectric substrate 2 may be ground with an abrasive material or grinding attachment to provide the roughened surface.

In the SAW filter 1, the comb-shaped electrode 3a of the IDT 3 and the comb-shaped electrode 4a of the IDT 4 are used as the input and output ends, respectively, and the comb-shaped electrodes 3b and 4b are connected to the ground potential. When an input voltage is applied to the comb-shaped electrode 3a of the IDT 3, BGS waves are excited on the piezoelectric substrate 2. The excited BGS waves are propagated in the direction which is substantially perpendicular to the substrate edge 2a and substrate edge 2b and reflected by the substrate edges 2a and 2b, whereby a fundamental wave and higher-order mode waves of the excited BGS waves are coupled with each other to produce a standing wave between the substrate edges 2a and 2b. An output based on the standing wave is thus obtained between the comb-shaped electrodes 4a and 4b of the IDT 4 provided in the lateral direction of the IDT 3. Therefore, the SAW filter 1 can operate as a transversal-coupled resonator type double mode SAW filter utilizing a BGS wave.

According to the SAW filter 1, it is not required to provide reflectors outside the IDTs 3 and 4. It is therefore possible to make the piezoelectric substrate 2 small. Further, since no reflector is used, it is possible to prevent the stop band from being affected by the reflection characteristics of reflectors and to prevent the surface acoustic wave from decaying between the IDT and reflectors and therefore to realize a SAW filter having a wide band and a small insertion loss.

Further, the outermost electrode finger distance D' defined by a distance from the substrate edges 2a or 2b to the center of the electrode finger adjacent to the outermost electrode finger 3f' or 4f' is set to be the above-mentioned specific value so as to suppress unwanted ripples in the passband. This will be explained in detail later.

Figure 3:
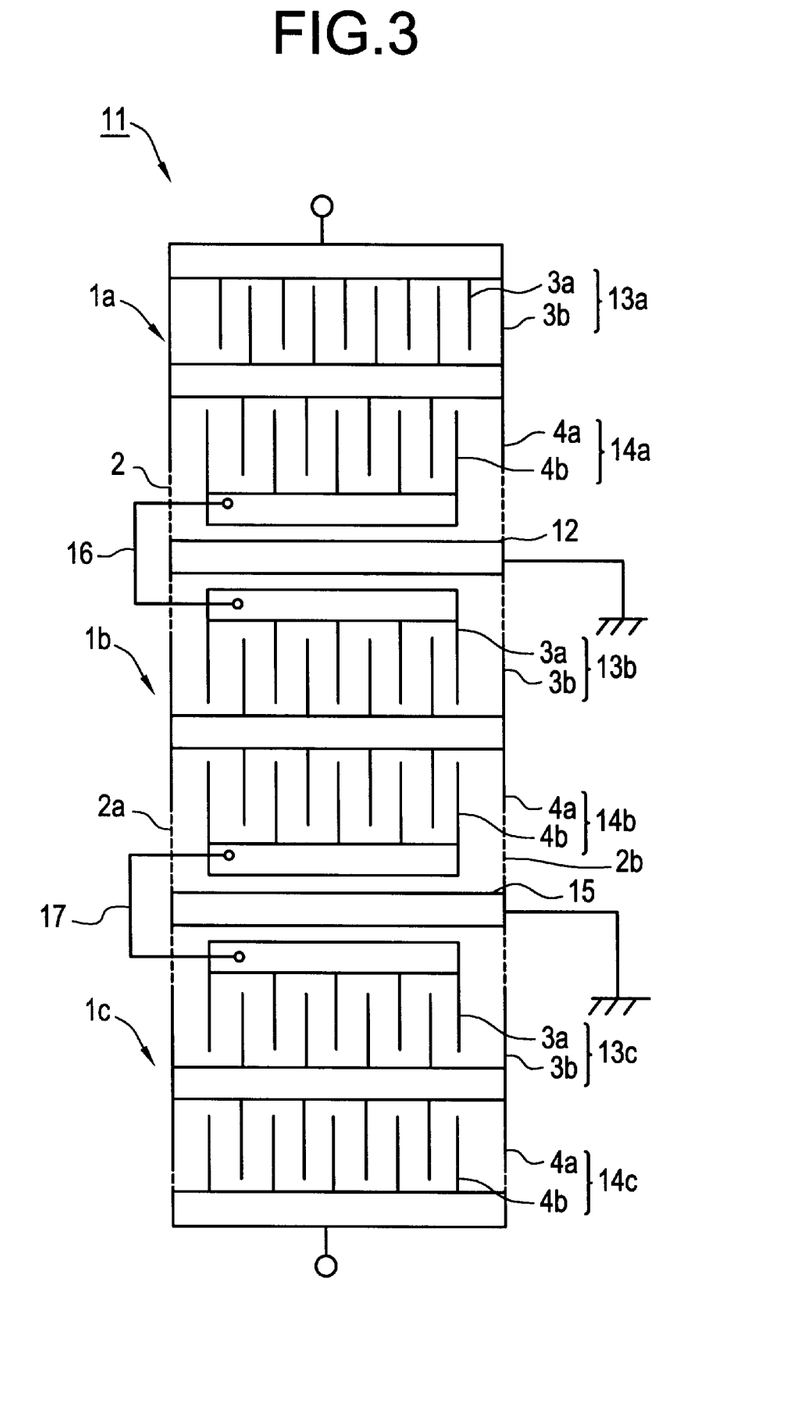
FIG. 3 is a schematic plan view for explaining a SAW filter in which three stages of SAW filters are connected in a lateral direction according to another preferred embodiment of the present invention.

Although one stage SAW filter 1 having the IDTs 3 and 4 is explained according to one preferred embodiment of the invention, a plurality of stages of SAW filters 1 may be arranged on the same substrate to provide a multi-stage connection type SAW filter. For example, as schematically illustrated in FIG. 3, a SAW filter 11 includes SAW filters 1a, 1b and 1c extending in a direction substantially parallel to two substrate edges 2a and 2b of the piezoelectric substrate 2.

More specifically, the SAW filters 1a, 1b and 1c respectively comprise IDTs 13a and 14a, 13b and 14b and 13c and 14c provided on the piezoelectric substrate 2 as explained in detail with referring to FIG. 1. Conductive patterns 12 and 15 connected to the ground potential are provided between the SAW filters 1a and 1b, and 1b and 1c. The conductive patterns 12 and 15 and the comb-shaped electrodes 3b and 4a may be grounded in common to a connection conductive portion (not shown) provided on the piezoelectric substrate or may be separately grounded. The comb-shaped electrode 4b of the IDT 14a and comb-shaped electrode 3a of the IDT 13b, and the comb-shaped electrode 4b of the IDT 14b and comb-shaped electrode 3a of the IDT 13c may be electrically connected respectively through either wires 16 and 17 or conductive patterns (not shown) on the piezoelectric substrate 2. The piezoelectric substrate 2 may have a roughened surface as explained above.

According to the SAW filter 11, since the three stages of SAW filters 1a, 1b and 1c are provided, the amount of the attenuation can be increased. Further, the conductive patterns 12 and 15 connected to the ground potential can reduce spurious response.

Although the piezoelectric substrate 2 of the SAW filter 1 or 11 is preferably made of piezoelectric single crystal, or piezoelectric ceramics, the piezoelectric substrate 2 may be an insulating substrate having a piezoelectric thin film, such as ZnO, thereon. Alternatively, an insulating film or the like may be further interposed between the insulating substrate and the piezoelectric thin film. It is also possible to use a piezoelectric substrate having a thin film such as piezoelectric film, dielectric film, insulating film or the like disposed on a surface thereof. In addition, as to the surface wave used, other SH type surface waves such as Love waves and leaky surface acoustic waves may be used other than BGS waves.

Hereinafter, a specific example of at least one preferred embodiment of the present invention will be described with reference to FIG. 3. In this specific example, a three-stage connection type SAW filter shown in FIG. 3 is manufactured.

A substrate made of lead titanate zirconate and having a thickness of 0.5 mm and dimensions of 2.2×1.8 mm is prepared as a piezoelectric substrate 2. After an aluminum film is formed on the piezoelectric substrate 2, the aluminum film is etched using a mask so as to form IDTs 13$a$, 13$b$, 13$c$ 14$a$, 14$b$ and 14$c$ having comb-shaped electrodes 3$a$ and 3$b$, and 4$a$ and 4$b$ on the piezoelectric substrate 2. The number of pairs of the electrodes finger is set to be 34 for all the IDTs 13$a$, 13$b$, 13$c$ 14$a$, 14$b$ and 14$c$. The space between the electrode fingers and the width of the electrodes fingers except the outermost electrode fingers are set to be 9.8 $\mu$m ($\lambda$/4), and the electrode finger distance is set 19.6 $\lambda$m ($\lambda$/2). The width of the outermost electrode fingers is set to be 4.92 $\mu$m which corresponds to (2.01$\lambda$)/16 and satisfies the inequalities (3). In this case, the distance D' is set to be 19.62 $\mu$m (8.01$\lambda$/16) and satisfies the inequalities (1).

An SAW filter according to a conventional comparative example is fabricated similarly to the SAW filter according to the inventive example described above except that the width of the outermost electrode fingers 3$f$ and 4$f$ is set to be 2.45 $\mu$m which corresponds to $\lambda$/16. In this case, the distance D' is set to be 17.15 $\mu$m (7$\lambda$/16). Therefore, the width of the outermost electrode finger and the distance D' are out of the ranges defined by the inequalities (3) and (1), respectfully, FIG. 4 shows insertion loss-frequency characteristics of the SAW filter according to the inventive example.

Figure 4:
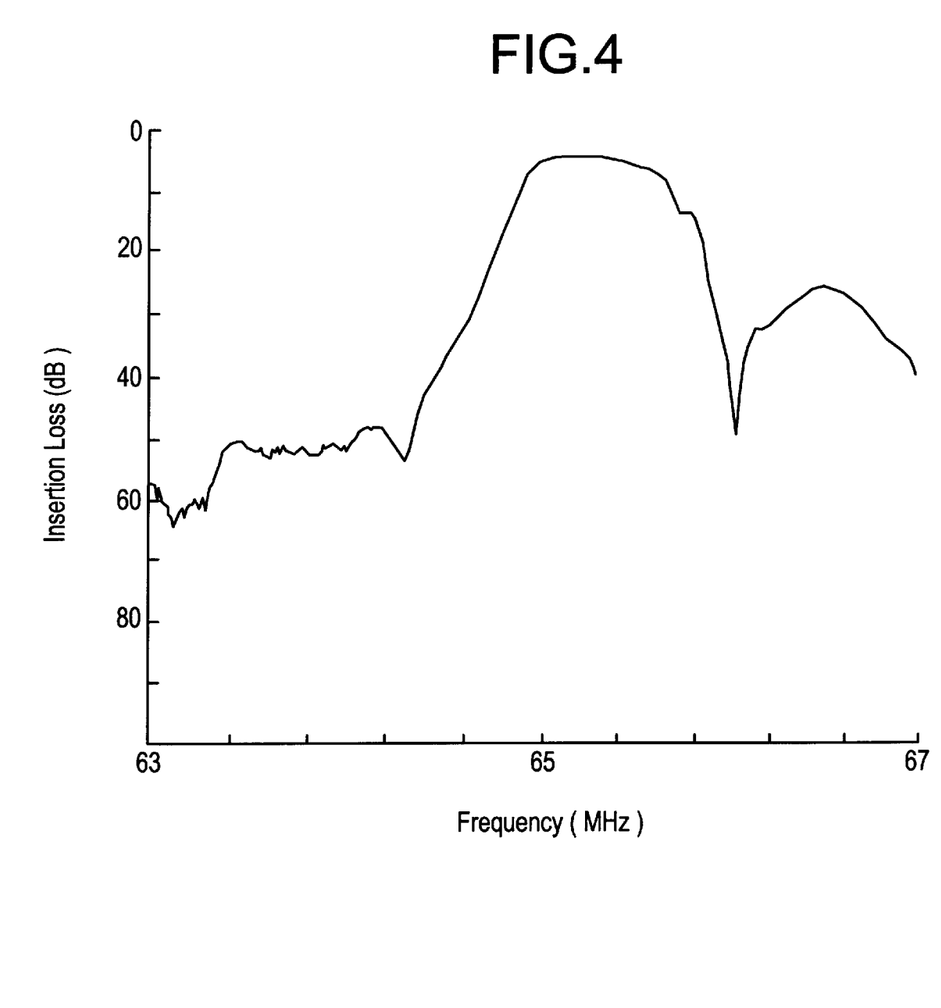
FIG. 4 is a graph showing the frequency-insertion loss characteristics of the SAW filter shown in FIG. 1.

It is apparent from FIG. 4 that a bandpass filter having a passband in the range from 64.77 to 65.43 MHz can be configured using the SAW filter of the inventive example.

Analysis of the characteristics shown in FIG. 4 on an magnified scale reveal that insertion loss in the passband is 4 dB and that the 3 dB bandwidth (the bandwidth within which insertion loss stays within 3 dB from the minimum insertion loss) is 1% of the center frequency of the filter. It has been confirmed that the SAW filter has the filter characteristics in which the attenuations at 64.2 MHz and 66.4 MHz are 46 dB and 25 dB, respectively. It is also apparent from FIG. 4, there are no substantial ripples within the passband.

Figure 5:
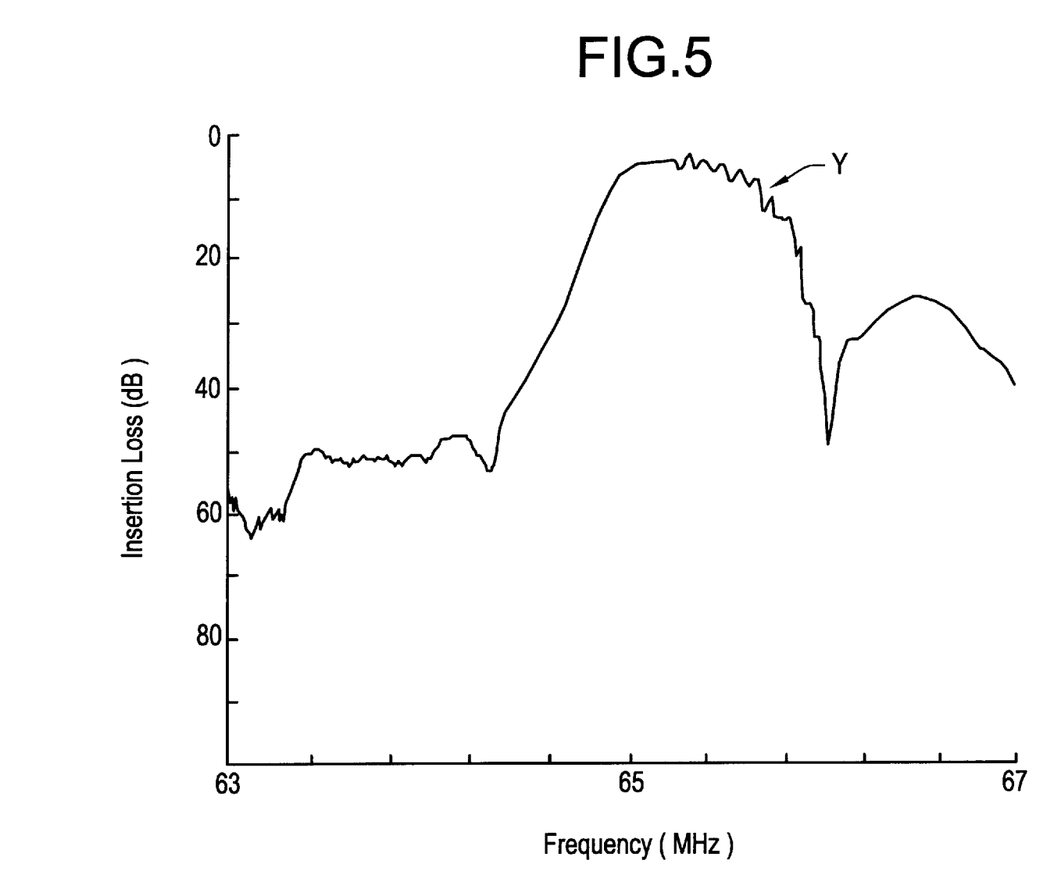
FIG. 5 is a graph showing the insertion loss-frequency characteristics of a SAW filter according to a comparative example.

On the other hand, as is apparent from FIG. 5, it is observed on the SAW filter of the comparative conventional example that some ripples occurred in the passband as indicated by the arrow Y.

As apparent from the results of the inventive example and the comparative conventional example, the preferred embodiments of the present invention make it possible to configure a transversal-coupled resonator type SAW filter having a wide passband and to suppress ripples in the passband effectively.

As a result of the further experiments carried out by the inventors, if the distance D' defined by a distance from substrate edges 2$a$ or 2$b$ to the center of the electrode finger adjacent to the outermost electrode finger 3$f$ or 4$f$ (FIG. 1) is set to be equal to or less than $\lambda$/2, substantial ripples are generated in the passband. On the other hand, if the outermost electrode finger distance D' is set to be greater than ($\lambda$/2+(5$\lambda$)/16), the amount of the attenuation of the obtained SAW filter is decreased. Accordingly, it is preferable to set the outermost electrode finger distance D' at the value defined by the inequalities (1).

Further, although in the above-explained example, the width of the electrode fingers other than the outermost electrode fingers and the space between the electrode fingers are set to be the same, i.e., to be about $\lambda$/4, it has been confirmed that the width of the electrode fingers other than the outermost electrode fingers may be greater than the space between the electrode (i.e., greater than about $\lambda$/4) as long as the outermost electrode finger distance is equal to the value defined by the inequalities (1).

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A transversal-coupled resonator type surface acoustic wave filter comprising:

a piezoelectric substrate having a pair of substrate edges which are substantially parallel to each other and which are arranged to reflect a shear horizontal type surface wave excited and propagated on a surface of the piezoelectric substrate in a direction substantially perpendicular to the substrate edges;

first and second interdigital transducers having a common resonance characteristic and provided on the piezoelectric substrate, each of the first and second interdigital transducers including a pair of outermost electrode fingers each of which is arranged to be flush with a respective one of the substrate edges of the piezoelectric substrate, and a pair of adjacent electrode fingers which are adjacent to the pair of the outermost electrode fingers, respectively; wherein a distance D' from one of the substrate edges of the piezoelectric substrate to a center of the corresponding adjacent electrode finger satisfies the following inequalities:

$$\lambda/2 < D' \leq (\lambda/2) + (5\lambda)/16$$

where $\lambda$ is a wavelength of the shear horizontal type surface acoustic wave excited on the piezoelectric substrate.

2. A transversal-coupled resonator type surface acoustic wave filter according to claim 1, wherein the piezoelectric substrate has a roughened back surface.

3. A transversal-coupled resonator type surface acoustic wave filter according to claim 2, wherein the roughened back surface has a plurality of grooves formed thereon.

4. A transversal-coupled resonator type surface acoustic wave filter according to claim 1, wherein each of the first and second interdigital transducers includes first and second comb-shaped electrodes each having a bus bar and a plurality of electrode fingers connected to the bus bar, the first and second comb-shaped electrodes being interdigitated with each other, the second comb-shaped electrodes of the first interdigital transducer sharing the bus bar of the first comb-shaped electrode of the second interdigital transducer.

5. A transversal-coupled resonator type surface acoustic wave filter according to claim 1, wherein each of the pair of outermost electrode fingers have a width w' which satisfies the following inequalities:

$$\lambda/8 < w' \leq (7\lambda)/16.$$

6. A transversal-coupled resonator type surface acoustic wave filter comprising:
a piezoelectric substrate having a pair of substrate edges which are substantially parallel to each other and reflect a shear horizontal type surface wave excited and propagated on a surface of the piezoelectric substrate in a direction substantially perpendicular to the substrate edges;
a plurality of transversal-coupled resonator type surface acoustic wave filter units electrically connected to each other and disposed on the piezoelectric substrate, the plurality of transversal-coupled resonator type surface acoustic wave filter units being arranged in a direction substantially parallel to the substrate edges of the piezoelectric substrate, each of the lateral coupling type surface acoustic wave filter units including first and second interdigital transducers having a common resonance characteristic and provided on the piezoelectric substrate, each of the first and second interdigital transducers including a pair of outermost electrode fingers each of which is arranged to be flush with a respective one of the substrate edges of the piezoelectric substrate, and a pair of adjacent electrode fingers which are adjacent to the pair of the outermost electrode fingers, respectively; wherein
a distance D' from one of the substrate edges of the piezoelectric substrate to a center of the corresponding adjacent electrode fingers satisfies the following inequalities:

$$\lambda/2 < D' \leq (\lambda/2) + (5\lambda)/16$$

where $\lambda$ is a wavelength of the shear horizontal type surface acoustic wave excited on the piezoelectric substrate.

7. A transversal-coupled resonator type surface acoustic wave filter according to claim 6, further including a conductive pattern located between the plurality of transversal-coupled resonator type surface acoustic wave filter units, the conductive pattern being disposed on the piezoelectric substrate and arranged to be connected to a ground level.

8. A transversal-coupled resonator type surface acoustic wave filter according to claim 7, wherein the piezoelectric substrate has a roughened rear surface.

9. A transversal-coupled resonator type surface acoustic wave filter according to claim 8, wherein the roughened rear surface has a plurality of grooves formed thereon.

10. A transversal-coupled resonator type surface acoustic wave filter according to claim 6, wherein each of the first and second interdigital transducers of each of the lateral coupling type surface acoustic wave filter units includes first and second comb-shaped electrodes each having a bus bar and a plurality of electrode fingers connected to the bus, the first and second comb-shaped electrodes being interdigitated with each other, the second comb-shaped electrodes of the first interdigital transducer sharing the bus bar of the first comb-shaped electrode of the second interdigital transducer.

11. A transversal-coupled resonator type surface acoustic wave filter according to claim 6, wherein each of the pair of outermost electrode fingers have a width w' which satisfies the following inequalities:

$$\lambda/8 < w' \leq (7\lambda)/16.$$

* * * * *